United States Patent
Davids et al.

(10) Patent No.: US 9,748,429 B1
(45) Date of Patent: Aug. 29, 2017

(54) AVALANCHE DIODE HAVING REDUCED DARK CURRENT AND METHOD FOR ITS MANUFACTURE

(71) Applicant: National Technology & Engineering Solutions of Sandia, LLC, Albuquerque, NM (US)

(72) Inventors: Paul Davids, Albuquerque, NM (US); Andrew Lee Starbuck, Albuquerque, NM (US); Andrew T. S. Pomerene, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 3 days.

(21) Appl. No.: 14/870,195

(22) Filed: Sep. 30, 2015

Related U.S. Application Data (63) Continuation-in-part of application No. 13/915,369, filed on Jun. 11, 2013, now Pat. No. 9,391,225.

(51) Int. Cl.
  *G01J 1/04* (2006.01)
  *H01L 31/107* (2006.01)
  *H01L 31/0232* (2014.01)
  *H01L 31/028* (2006.01)

(52) U.S. Cl.
  CPC ........ *H01L 31/1075* (2013.01); *H01L 31/028* (2013.01); *H01L 31/02327* (2013.01)

(58) Field of Classification Search
  CPC .... G02B 6/02; G02B 6/10; G02B 6/24; H01L 31/107; H01L 31/1075; H01L 31/02027; H01L 31/02327; H01L 31/028
  USPC .................................. 250/227.11; 257/186
  See application file for complete search history.

(56) References Cited

U.S. PATENT DOCUMENTS

| | | | |
|---|---|---|---|
| 5,082,629 A * | 1/1992 | Burgess, Jr. | G01N 21/552 356/128 |
| 6,946,371 B2 | 9/2005 | Langdo et al. | |
| 7,397,101 B1 * | 7/2008 | Masini | H01L 31/028 257/184 |
| 7,453,129 B2 | 11/2008 | King et al. | |
| 8,173,551 B2 * | 5/2012 | Bai | C30B 25/183 257/E21.09 |
| 2004/0251483 A1 | 12/2004 | Ko et al. | |
| 2007/0104441 A1 | 5/2007 | Ahn et al. | |
| 2008/0231339 A1 | 9/2008 | Deschamps | |
| 2012/0126286 A1 | 5/2012 | Na et al. | |

OTHER PUBLICATIONS

Bai, et al., "Study of the defect elimination mechanisms in aspect ratio trapping Ge growth", Applied Physics Letter, 2007, pp. 101902-1-101902-3, vol. 90.

Park, et al.,"Defect reduction of selective Ge epitaxy in trenches on Si(001) substrates using aspect ratio trapping", Applied Physics Letter, 2007, pp. 052113-1-052113-3, vol. 90.

* cited by examiner

*Primary Examiner* — Georgia Y Epps
*Assistant Examiner* — Kevin Wyatt
(74) *Attorney, Agent, or Firm* — Martin I. Finston (57) ABSTRACT

An avalanche diode includes an absorption region in a germanium body epitaxially grown on a silicon body including a multiplication region. Aspect-ratio trapping is used to suppress dislocation growth in the vicinity of the absorption region.

8 Claims, 13 Drawing Sheets

AVALANCHE DIODE HAVING REDUCED DARK CURRENT AND METHOD FOR ITS MANUFACTURE

CROSS-REFERENCE TO RELATED APPLICATIONS

This application is a continuation-in-part of the commonly owned U.S. patent application Ser. No. 13/915,369 filed on Jun. 11, 2013 under the title "Two-Dimensional APDs and SPADs and Related Methods", the entirety of which is hereby incorporated herein by reference.

GOVERNMENT LICENSE RIGHTS

This invention was developed under Contract DE-AC04-94AL85000 between Sandia Corporation and the U.S. Department of Energy. The U.S. Government has certain rights in this invention.

FIELD OF THE INVENTION

The invention relates to avalanche photodiodes and methods of their manufacture. The invention relates more particularly to avalanche diodes realized in the germanium-silicon materials system.

ART BACKGROUND

Avalanche photodiodes (APDs) have applications as very sensitive detectors of optical signals. When operated with a reverse voltage greater than its breakdown voltage, a mode of operation often referred to as "Geiger mode", an avalanche photodiode can in some instances be used to receive and measure a single photon. A device suitable for such purpose is sometimes referred to as a "single photon avalanche detector" (SPAD).

In the operation of an avalanche photodiode, charge carriers generated by photon absorption are accelerated by a strong electric field due to an applied reverse voltage. This leads to impact ionization and consequent current gain in a portion of the device referred to as the "multiplication region".

Avalanche photodiodes have been made in various semiconductor material systems. Known designs include, for example, a p-i-n structure in a vertically layered geometry, in which an upper germanium portion contains the optical absorption region and a lower silicon portion contains the multiplication region.

Recently, we developed a modified germanium/silicon p-i-n design in which the multiplication region is laterally offset from the germanium absorption region. Our modified design is described in U.S. patent application Ser. No. 13/915,369, which is cited above and the entirety of which is hereby incorporated herein by reference.

One factor that limits the performance of avalanche photodiodes is the dark current, i.e., the current that arises in the absence of light due to factors such as leakage at the diode surface and thermal carrier generation. Because of dark current, light levels that fall below a minimum threshold cannot be detected. This is important for avalanche diodes in general, but especially important for SPADs.

To achieve still greater sensitivity of optical detection using avalanche diodes, there remains a need for new approaches to the suppression of dark current.

SUMMARY OF THE INVENTION

Lattice dislocations are known to be one source of dark current in semiconductors, where such defects can behave as carrier generation-recombination centers. Threading dislocations have been observed to form in germanium when it is epitaxially grown on a silicon substrate. This has been attributed to the four percent lattice mismatch between germanium and silicon. In germanium/silicon avalanche diodes, the presence of threading dislocations in and near the absorption region contributes to the dark current and also can cause afterpulsing when the detector is operated in Geiger mode.

Previous authors have reported that when the epitaxial growth of germanium on [001] silicon is confined to a sufficiently narrow trench between bounding walls of a dielectric such as silicon oxide, the dislocations tend to form in a surface that propagates upward at an oblique angle to the substrate surface. It was reported, moreover, that dislocation growth was suppressed above the lines where the dislocated surfaces terminated on the trench walls. The name proposed for this phenomenon was "aspect ratio trapping" because the dislocations could effectively become trapped within trenches of sufficiently small aspect ratio, i.e. in which the width is a sufficiently small fraction of the depth.

We have found a way to apply this known phenomenon to reduce dark current in avalanche photodiodes. More specifically, we have developed a design for an avalanche diode and a fabrication process for its realization. In our approach, aspect ratio trapping leads to a diode structure in which the germanium side is substantially free of dislocations in and near the absorption region.

Accordingly, the invention in one aspect encompasses a germanium/silicon avalanche diode. An embodiment comprises a silicon body having a planar upper surface and containing a multiplication region, a germanium layer grown epitaxially on portions of the silicon upper surface and containing an absorption region, and a waveguide optically coupled to the germanium layer with respect to light of at least one operating wavelength. The embodiment further comprises a dielectric spacer layer interposed between the silicon body and the germanium layer. The germanium layer includes at least one trench-fill portion that extends through the spacer layer to the silicon upper surface.

FIGS. 13A, 13B, 14A, and 14B provide a comparative example illustrating the benefits of aspect ratio trapping for germanium-on-silicon devices.

DETAILED DESCRIPTION

The following discussion commences with a review of the avalanche photodiode (APD) structure and variations thereof that were described in the above-cited U.S. patent application Ser. No. 13/915,369. We will then describe an example of a design modification that incorporates aspect ratio trapping for improved performance.

Figure 1:
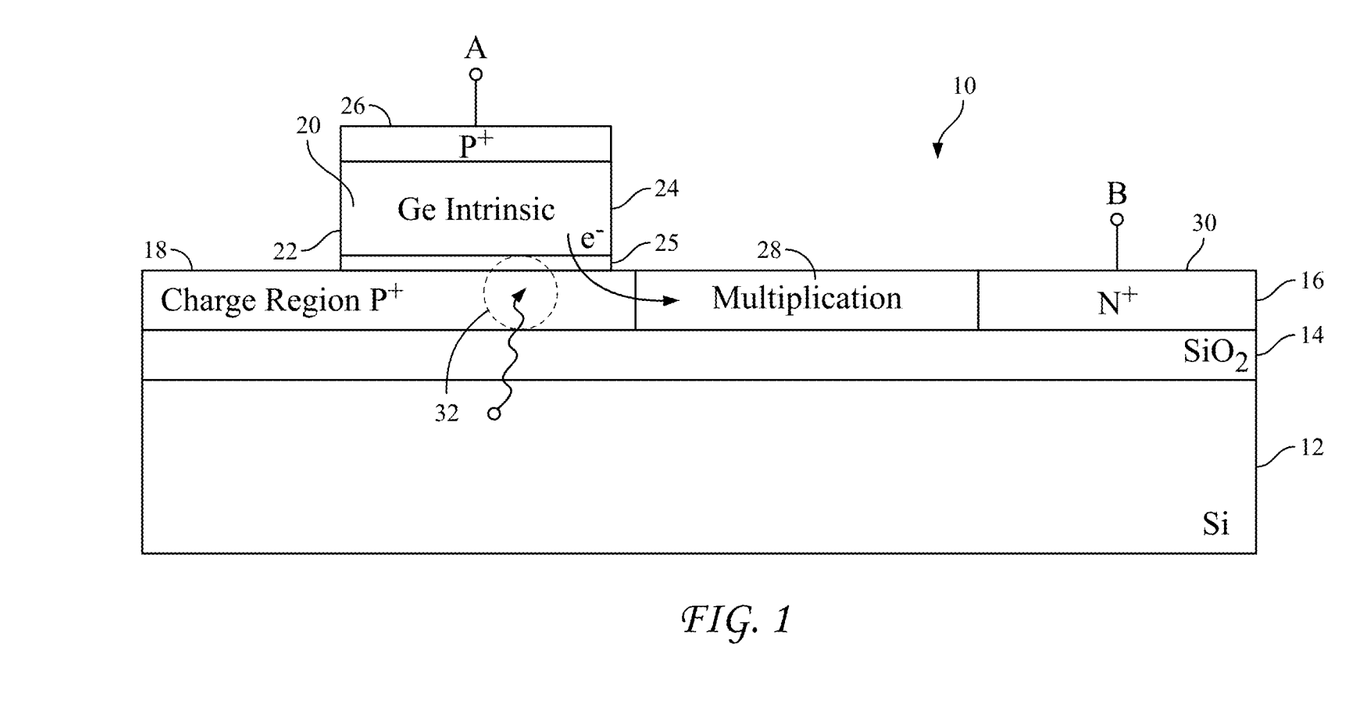
FIG. 1 is a schematic, side elevational view in cross section of an exemplary device in accordance with a design disclosed in the above-cited U.S. patent application Ser. No. 13/915,369.

FIG. 1 depicts a side view of a device 10, such as an APD. The device 10 includes a silicon substrate 12, an insulating layer 14 and a relatively thin (e.g., less than one micrometer in thickness) silicon surface layer 16. The insulating layer 14 is made from silicon dioxide ($SiO_2$) for example. The substrate 12 and layers 14, 16 are jointly referred to as a silicon-on-insulator or SOI structure or "platform".

The silicon surface layer 16 comprises a region 18 formed within a predetermined area of the layer 16. In the example shown in FIG. 1, region 18 comprises a p-type silicon "charge" region. It should be understood that the device 10 includes a complementary doping configuration where for the sake of illustration, a first dopant type is be p-type silicon, and a second dopant type is n-type silicon. The region 18 is here referred to as a charge region of a first conductivity type within layer 16.

The device 10 further comprises a germanium (Ge) photon absorption layer 20 positioned over region 18. In the embodiment depicted in FIG. 1, the layer 20 is positioned such that region 18 extends laterally in either direction beyond sidewalls 22 and 24 of the layer 20. For example, region 18 is wider than layer 20 at their interface. It will be understood that a portion of region 18 extends beyond the right-hand side wall 24 of layer 20 in order to insure that an electric field is created within the multiplication region 28.

In an example, the layer 20 is an epitaxial layer of germanium grown on the silicon surface layer 16 using a known selective epitaxial growth process. A p-type silicon contact area or first electrical contact region 26 is formed over the germanium layer 20. The contact region serves as a first electrical terminal "A" used to establish a reverse bias current in the APD 10 along with a second electrical contact region, or terminal "B" discussed below.

The layer 16 further comprises a multiplication region 28. In the embodiment depicted in FIG. 1, the region 28 is positioned laterally adjacent to region 18. Region 28 comprises an intrinsic silicon region. It should be noted that the device 10 differs from conventional one-dimensional avalanche photodiodes (APDs) in that the one-dimensional devices stack a multiplication region over a germanium layer. In contrast, the device 10 includes a multiplication region 28 that is laterally adjacent to the germanium layer. Because of the lateral displacement instead of vertical stacking, device 10 of FIG. 1 can be considered a two-dimensional device.

Region 28 is positioned to be separate and spaced-apart from the germanium absorption layer 20. The spatial separation between the multiplication region 28 and the germanium (photon) absorption region 20 permits the absorption of photons within region 20 to be optimized independently of the amplification (i.e., impact ionization rate) within the multiplication region 28.

The layer 16 further comprises a second silicon contact region, i.e. n-type silicon contact region 30, which serves as the second electrical terminal "B".

The p-type charge region 18 is operable to generate an electric field that urges carriers generated in the germanium absorption layer 24 into the multiplication region 28, as explained below.

In operation of device 10, an incoming optical signal "O" is coupled into an area 32 of the p-type charge region 18 that directly underlies the germanium layer 24 via an optical waveguide. The optical waveguide is not shown in FIG. 1, but useful reference in this regard may be made to element 40 of FIG. 4. In exemplary applications, the optical signal O contains wavelengths above 1100 nm such as wavelengths at 1300 nm and 1550 nm.

In the presence of a strong reverse bias voltage ($V_{BV}$) applied between terminals A and B (e.g., tens of volts or higher), the germanium layer 24 can, in operation, receive and absorb photons from optical signal O in a photogeneration process that creates mobile carriers from the absorbed photons. More specifically, electron-hole pairs are photogenerated, and they flow into multiplication region 28. There, as a consequence of the avalanche effect, the photogenerated carriers generate an amplified electrical photocurrent.

Figure 2:
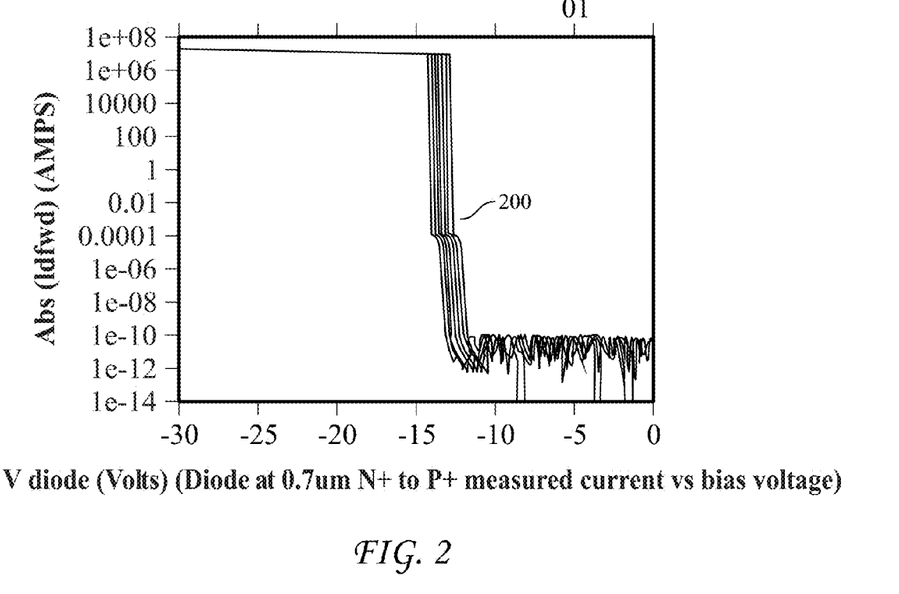
FIG. 2 depicts an exemplary graph of a generated photocurrent versus reverse bias voltage for an exemplary device similar to the device of FIG. 1.

FIG. 2 provides a graph 200 of photocurrent versus reverse bias voltage $V_{BV}$ for an APD such as device 10 of FIG. 1. As seen in the graph, the avalanche effect is triggered at a reverse bias voltage of 13V. To perform as shown, the charge region 18 of device 10 would have, e.g., a doping level on the order of $10^{18}$ cm$^{-3}$.

Figure 3:
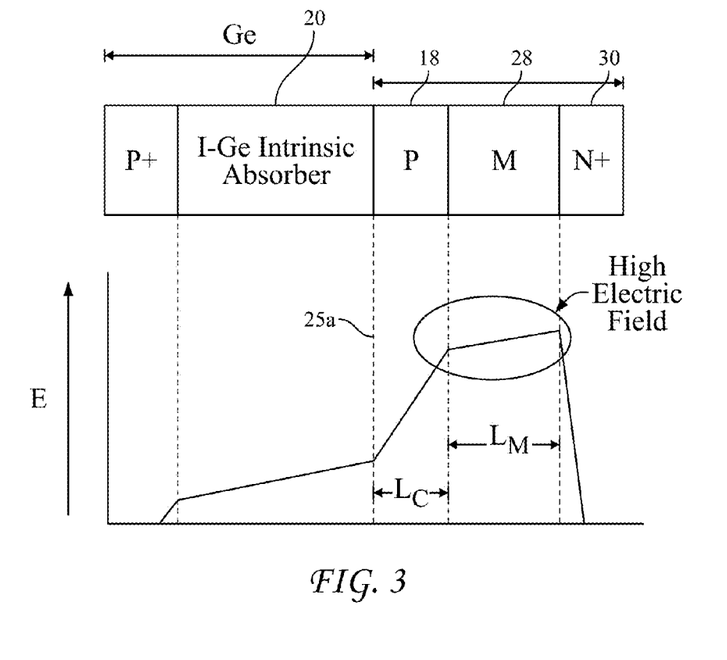
FIG. 3 depicts a graph of electric fields generated within various regions of an exemplary device similar to the device of FIG. 1.

FIG. 3 provides a graph that conceptually illustrates the variation of the electric field with depth under reverse bias in an APD such as device 10 of FIG. 1. As seen in FIG. 1, a heterojunction layer 25 lies between germanium absorption layer 20 and charge region 18. Layer 25 advantageously lies at a position where the increase with depth of the field generated by the charge region 18 begins to steepen. The vertical line 25a in FIG. 3 indicates the position of layer 25.

The length "$L_C$" of the charge region 18 can be selected in view of a specific breakdown voltage of the APD 10 and the level of dark current that can be tolerated.

As shown in FIG. 3, the electric field generated by the region 18 will generally be strongest within multiplication region 28, but its gradient will generally be greater in charge region 18. In fact, the electric field can remain substantially constant within multiplication region 28, and such behavior may even be desirable for some applications. The length "$L_M$" of multiplication region 28, which is typically on the order of a few micrometers, is a factor controlling the amount of gain that may be achieved.

The second electrical contact region 30 can suppress or extinguish the multiplication or amplification effect (hereafter collectively referred to as "amplification" effect) by reducing the electric field to a small value, or even to zero. Alternatively, as will be discussed below, a quenching region can be added that, in operation, will suppress or extinguish the amplification effect.

Known CMOS processing techniques can be used to fabricate device 10 and numerous variations thereof.

Various methods of coupling an optical signal into the avalanche photodiode are contemplated. For example, turning back to device 10 of FIG. 1, optical power from a waveguide, optical fiber or free-space signal may be injected into device 100 by end-fire coupling into area 32 of region 16. Alternatively, a waveguide may be incorporated with the APD structure by integrating it on the same silicon platform.

Figure 4:
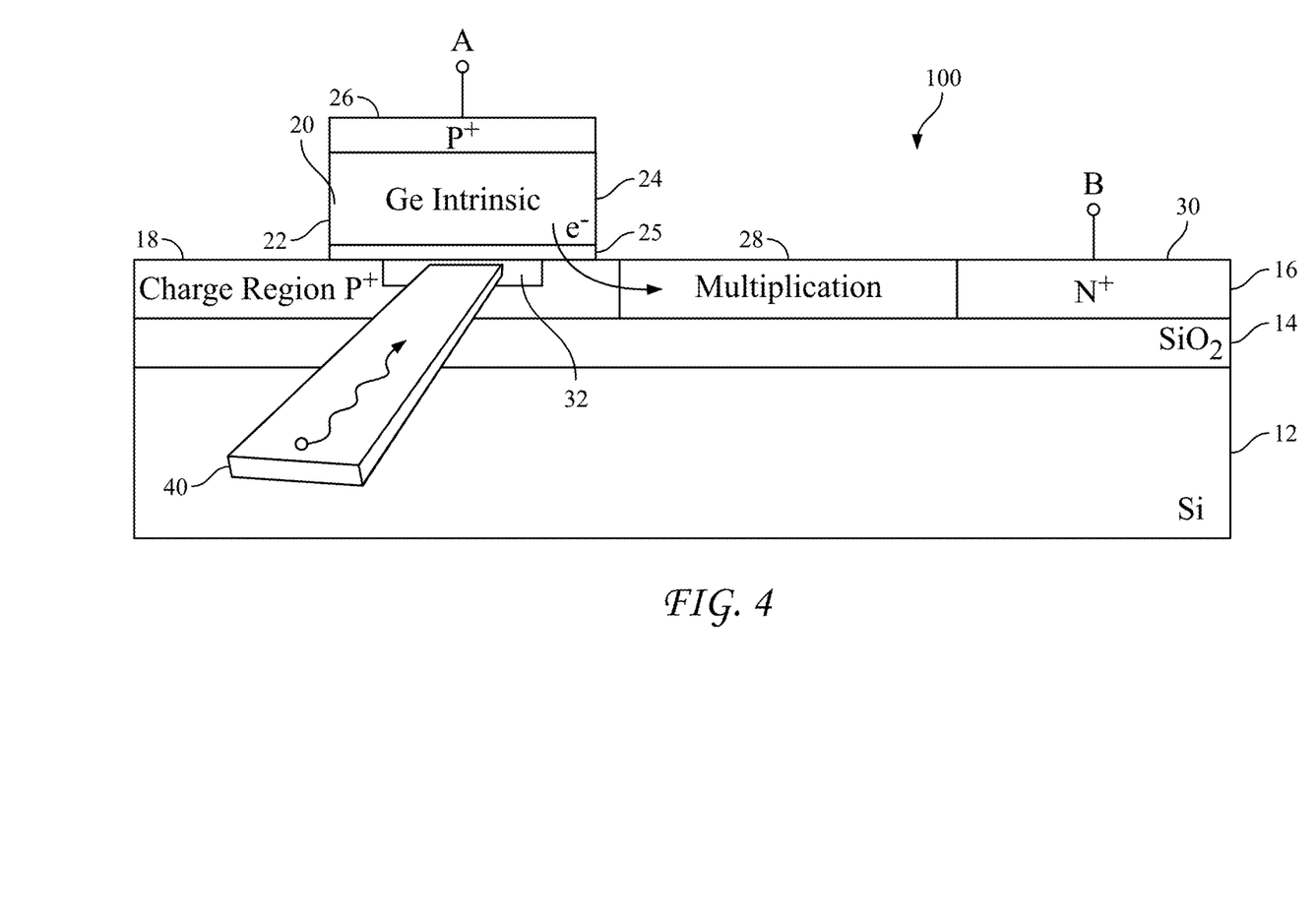
FIG. 4 is a schematic, side elevational view in cross section of a variation of the device of FIG. 1 that was likewise disclosed in the above-cited U.S. patent application Ser. No. 13/915,369.

FIG. 4 provides a view of a device 100 that comprises such an integrated silicon-based waveguide integrated with an APD structure. As shown, the silicon surface layer 16 comprises an integrated waveguide 40 (shown extended from area 32). This integrated, monolithic configuration may be preferred in applications where a more compact device is required. The use of standard CMOS processing techniques allows the silicon waveguide 40 to be positioned or otherwise formed in optical alignment with the germanium absorption layer 20, thus reducing optical coupling losses. Moreover, the fabrication of integrated structure by CMOS techniques facilitates the formation of waveguide 40 as a single-mode waveguide, which is difficult to achieve by other more conventional methods.

Figure 5:
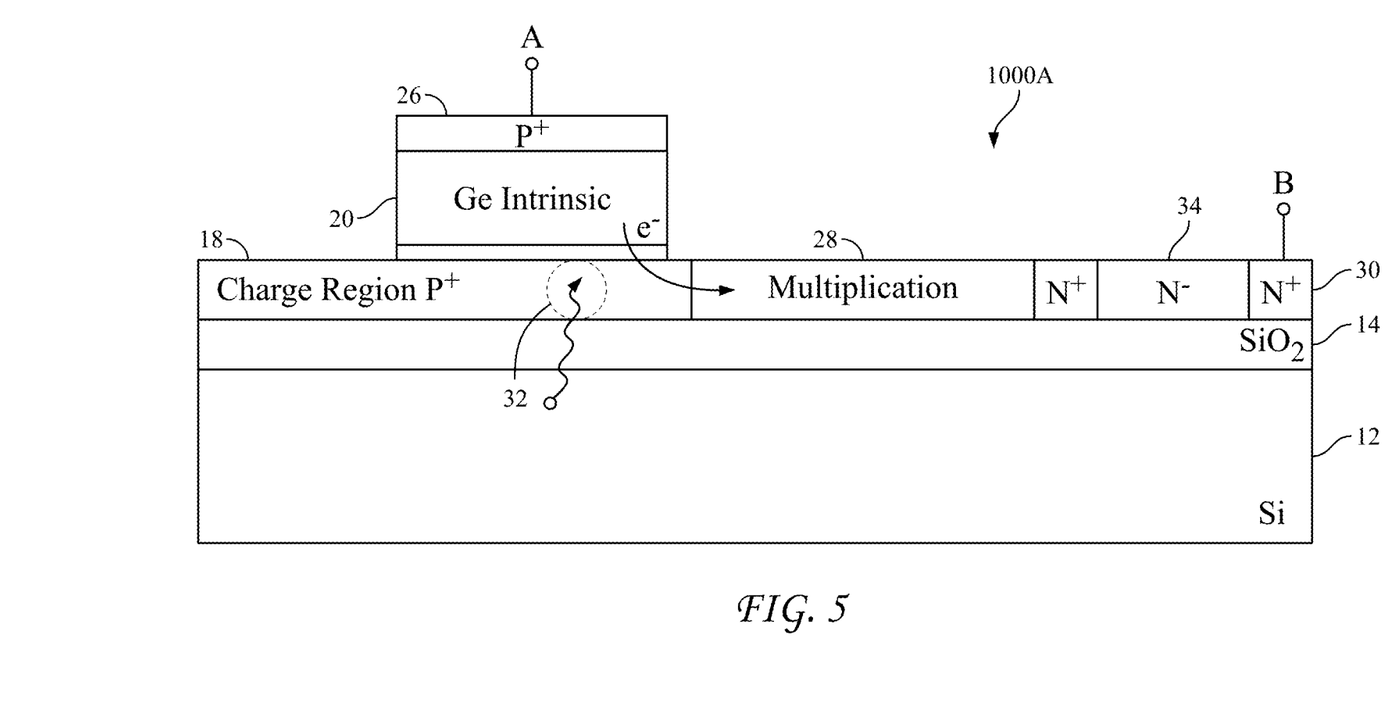
FIG. 5 is a schematic, side elevational view in cross section of another variation of the device of FIG. 1 that was likewise disclosed in the above-cited U.S. patent application Ser. No. 13/915,369. The device of FIG. 5 includes an example of a quenching region.

Referring now to FIG. 5, there is depicted a side view of a two-dimensional device 1000a in which a quenching region 34 is used to reduce the breakdown voltage for a period of time to suppress the amplification process within the multiplication region. The quenching region may be regarded as controlling the amplified photocurrent of the multiplication region.

Quenching region 34 may, e.g., control the switching speed of the APD by turning the amplification process off. This allows the APD to be ready to receive a next optical signal that may turn the APD on. As will be discussed below, quenching is particularly useful in the context of SPADs or Geiger mode APDs.

In embodiments, quenching region 34 comprises a resistor or resistive region. In embodiments, quenching region 34 is created by modifying the concentration of the dopant within, e.g., the second contact region 30. By way of illustration, quenching region 34 is labeled with the legend "N⁻" to signify that it is a lightly-doped area. The use of a resistive region for this purpose is considered a type of passive quenching because the resistance of the region is the only parameter that controls the amplification process.

Figure 6:
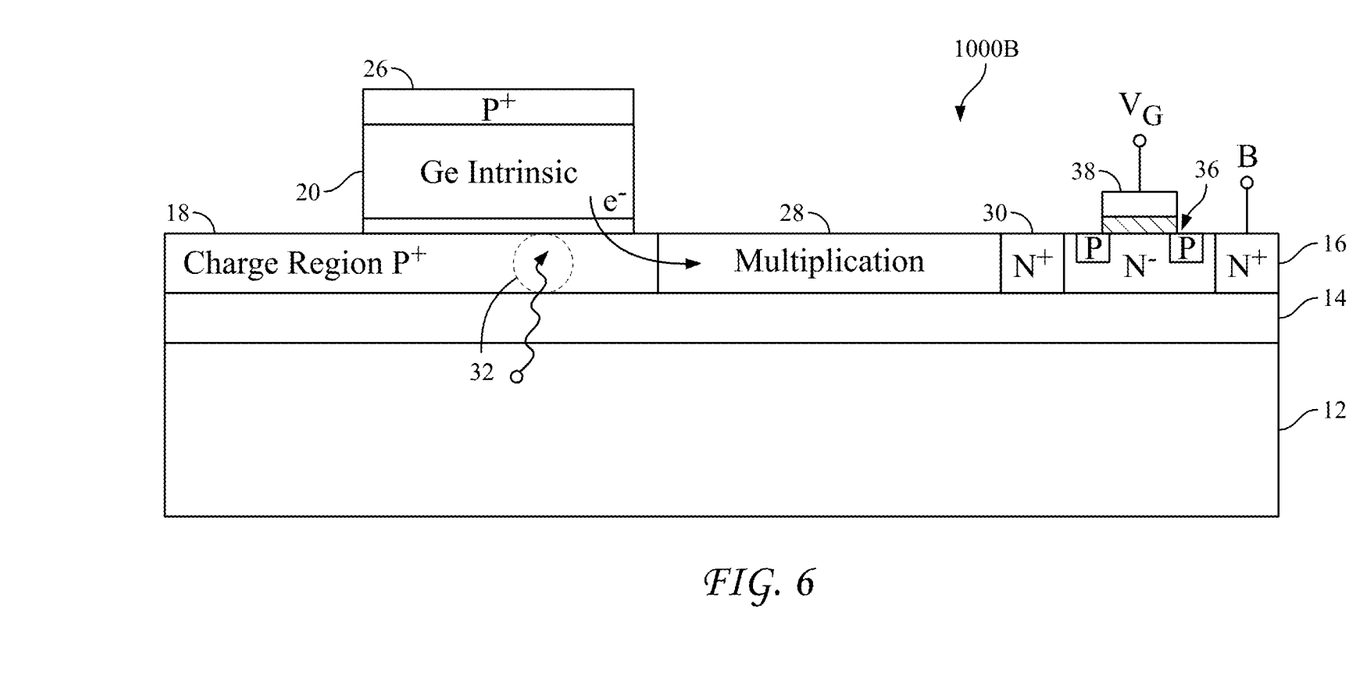
FIG. 6 is a schematic, side elevational view in cross section of another variation of the device of FIG. 1 that was likewise disclosed in the above-cited U.S. patent application Ser. No. 13/915,369. The device of FIG. 6 includes an alternate example of a quenching region.

Other approaches use active quenching. FIG. 6 depicts an exemplary two-dimensional device 1000b that comprises an integrated, active quenching region 36. The active quenching region 36 comprises, e.g., an MOS transistor structure 36 positioned adjacent to the multiplication region 28. In operation, a gate voltage ($V_G$) is applied to a gate 38 of structure 36 in order to control the speed at which the amplification process is suppressed or extinguished.

Figure 7:
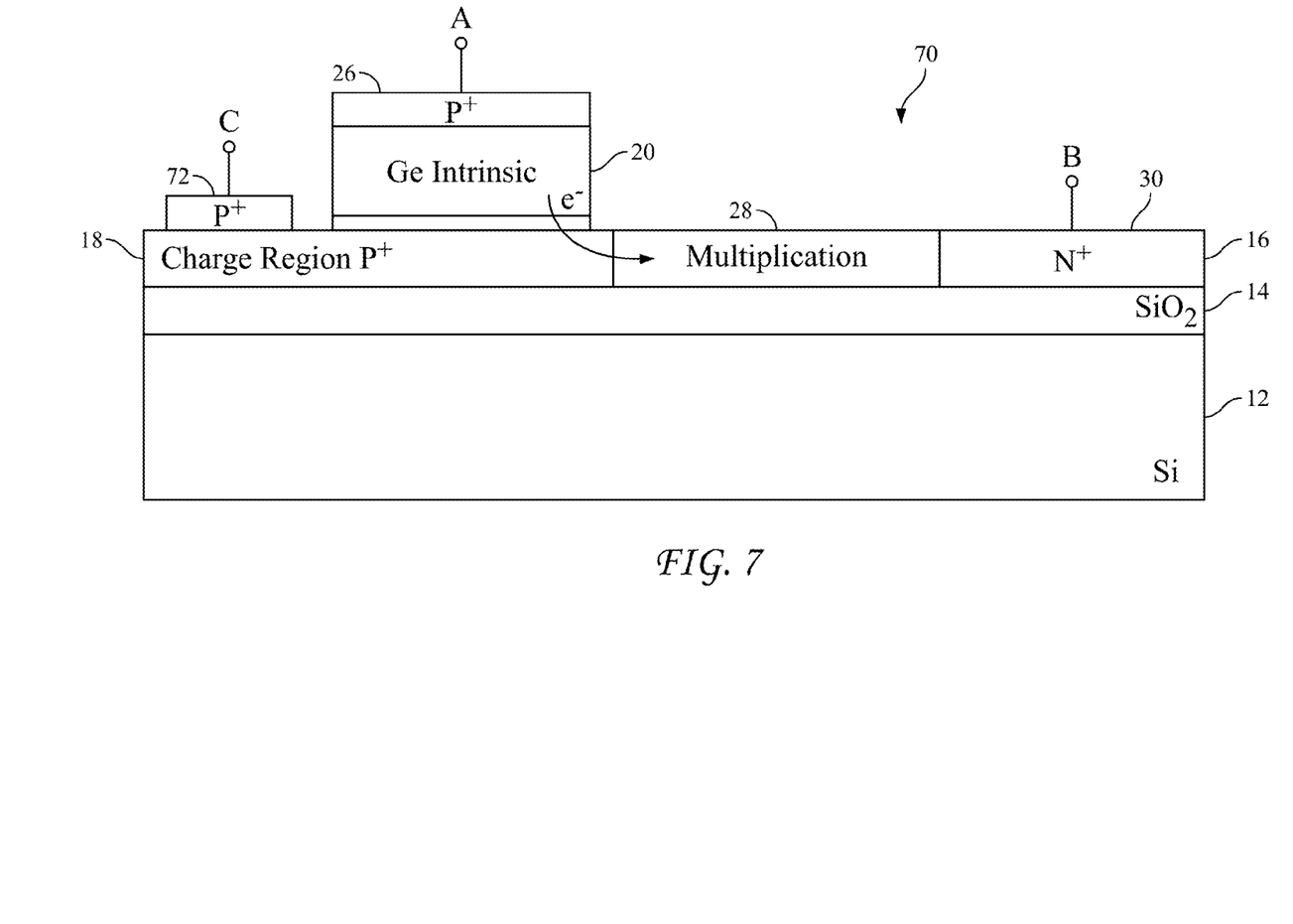
FIG. 7 is a schematic, side elevational view in cross section of an avalanche photodiode configured as a three-terminal device according to an implementation that was disclosed in the above-cited U.S. patent application Ser. No. 13/915,369.

For greatest efficiency, it is desirable for the electric field to be stronger within the multiplication region than within the germanium absorption layer. The difference in strength between the electric fields in the respective regions of the APD causes mobile carriers to flow into the multiplication region. A highly efficient APD can be configured to include three terminals. FIG. 7 depicts a side view of a three-terminal, two-dimensional device 70.

As shown in FIG. 7, device 70 includes elements similar to those of the device 1 in FIG. 1, and additionally includes a third electrical contact region 72. Region 72 is configured, for example, as a p-type conductivity charge region. Region 72 also comprises, and is here referred to as, terminal "C". As depicted, device 70 comprises three electrical contact regions. Charge region 18 is configured to include one of the three electrical contact regions, specifically in this example region 72 (terminal C). It should be noted that the region 18 extends beyond the perimeter of the germanium absorption layer 20 so as to accommodate the formation of a third electrical contact region 72.

When a voltage is applied between terminals C and A, an electric field is created within germanium absorption layer 20, allowing for mobile carriers formed by the absorption of photons to be quickly swept out of layer 20 and accelerated into multiplication region 28. A large reverse bias applied between terminals A and B supports the amplification process, i.e., impact ionization and avalanche reactions within multiplication region 28.

We have found that the application of a bias voltage between terminals C and A can improve the quantum efficiency (QE) of the device 70 (e.g., APD). Accordingly, in operation of the example of FIG. 7, two of three electrical contacts (e.g., the terminals A and C) receive electrical inputs to create such a bias voltage. The voltage created between the terminals A and C can be controlled with respect to a high voltage applied to terminal B such that breakdown occurs in multiplication region 28, and not within the germanium absorption layer 20.

Stated differently, the electric field produced in the germanium absorption region 20 is less than the electrical field produced in the multiplication region 28, forcing breakdown to occur only in multiplication region 28. This has the effect of increasing or accelerating the flow of one or more mobile carriers into the multiplication region 28 by increasing the percentage of incoming photons that yield charge carriers. This flow increases the gain (amplification) created by the multiplication region 28.

As mentioned above, in a SPAD or Geiger-mode APD a single carrier can trigger an amplification effect in a multiplication region. As a result, a SPAD may be able to detect extremely low intensity input optical signals and may even be able to announce the arrival times of single photons with a jitter of only a few tens of picoseconds. One difference between a SPAD and the APDs described herein is that a SPAD is designed to operate with a reverse bias voltage well above its associated breakdown voltage.

Because the breakdown may be self-sustaining, a SPAD must include some means for turning off the generated electrical photocurrent so that the next incoming photon can be properly detected. As described above, a quenching region may be used. Quenching and resetting the SPAD typically occurs in two steps. In the first step a bias voltage is reduced below the breakdown voltage, thereby quenching a photocurrent as quickly as possible. In a second step, the bias voltage is then raised to a voltage above the breakdown voltage so that the next low intensity input optical signal can be detected.

Figure 8:
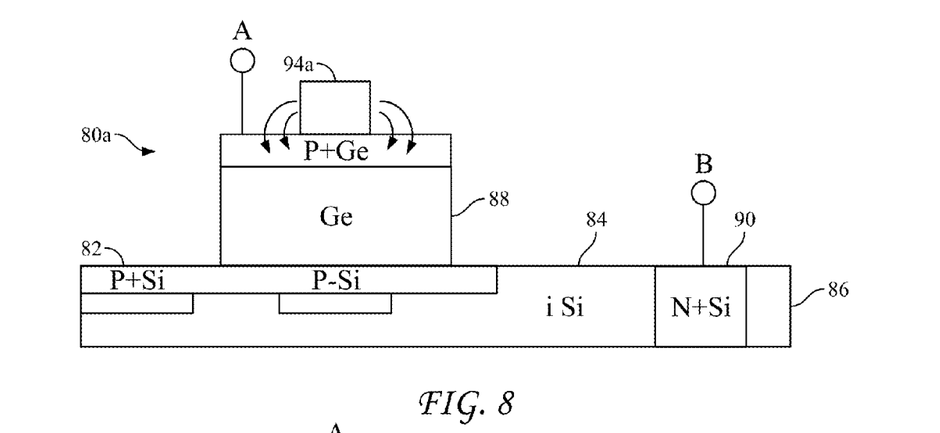
FIG. 8 is a schematic, side elevational view in cross section of an exemplary SPAD device in accordance with a design disclosed in the above-cited U.S. patent application Ser. No. 13/915,369.

FIG. 8 illustrates an exemplary two-dimensional device 80a, such as an SPAD, in accordance with an embodiment of the present invention. Similar to the embodiments described before, device 80a includes a silicon platform comprising a silicon surface layer 86 of an SOI structure that comprises a p-type conductivity charge region 82 and an (intrinsic) multiplication region 84. Further, the device 80a comprises a germanium absorption layer 88 positioned over region 82, and an n-type conductivity contact region 90. A quenching region (not shown) may also be included to insure that the device 80a is responsive. In order to function as an SPAD, the voltage applied between terminals A and B needs to be above the breakdown voltage of the device. For that purpose, the device 80a includes first and second contact regions A, B that are operable to receive signals to create a voltage greater than a breakdown voltage.

Optical input to device 80a of FIG. 8 occurs by evanescent optical coupling from waveguide 94a to germanium absorption layer 88. As is well known in the art, evanescent coupling does not require direct physical contact between the interacting elements, but only sufficient proximity between them to allow their respective mode fields to overlap. Thus in the figure, waveguide or waveguiding layer 94a (generally referred to hereinafter as a "waveguide") is positioned in sufficient proximity to the germanium absorption layer 88 to couple the optical signal to the germanium absorption layer 88. More particularly, the optical waveguide 94a is positioned on a predetermined extent of a top surface of the germanium absorption layer 88 to couple the optical signal to the germanium absorption layer 88.

By way of example, waveguide 94a is a silicon nitride waveguide positioned with respect to the germanium absorption layer 88 to allow the optical signal propagating along the longitudinal extent of the waveguide 94a to evanescently couple into germanium layer 88 (as shown by the arrows in FIG. 8). The use of a silicon nitride material as layer 94a allows for the use of multiple wavelengths through the visible and near-IR part of the spectrum (e.g., wavelengths above 1100 nm, such as 1300 and 1550 nm) because the presence of silicon nitride generates a mechanical-type strain at an interface with the germanium absorption layer 88 that shifts the bandwidth of the layer 88 to longer wavelength values. It should be understood, however, that silicon or any of various other silicon-based materials may be the constituent material for layer 94a without deviating from the scope of the present invention.

The use of evanescent coupling (as opposed to, e.g., direct end-face coupling) can significantly reduce optical reflections at the interface between the waveguide 94a and layer 88, thus improving the quantum efficiency of the device 80a. The quantum efficiency is an important parameter for SPAD devices due to the need to operate with greater sensitivities than conventional APDs.

Figure 9:
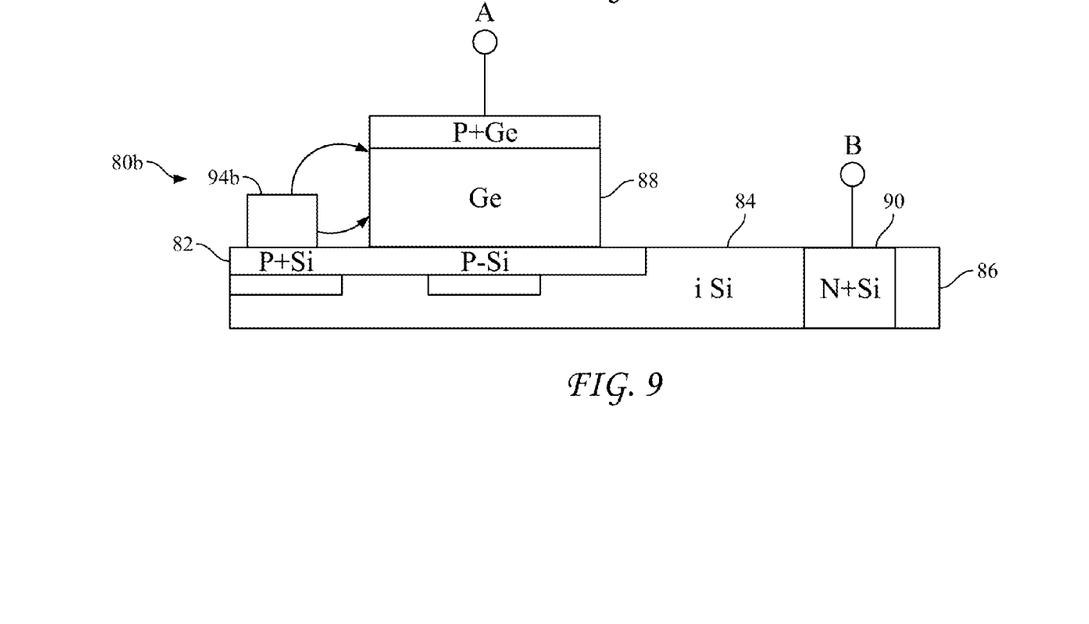
FIG. 9 is a schematic, side elevational view in cross section of an alternative design for a SPAD device that was likewise disclosed in the above-cited U.S. patent application Ser. No. 13/915,369.

In SPAD device 80b of FIG. 9, the waveguide 94b occupies an alternative position from which it can still evanescently couple to the germanium absorption layer 88. Specifically, the waveguide 94b is now positioned on a predetermined extent of a side surface of the germanium absorption layer 88.

Implementations with Aspect Ratio Trapping

As explained above, we have learned to modify avalanche photodiode designs such as those described above by adding aspect-ratio trapping features that are effective for improving performance. We will now describe the design and fabrication of an exemplary avalanche diode that includes such features.

Figure 10:
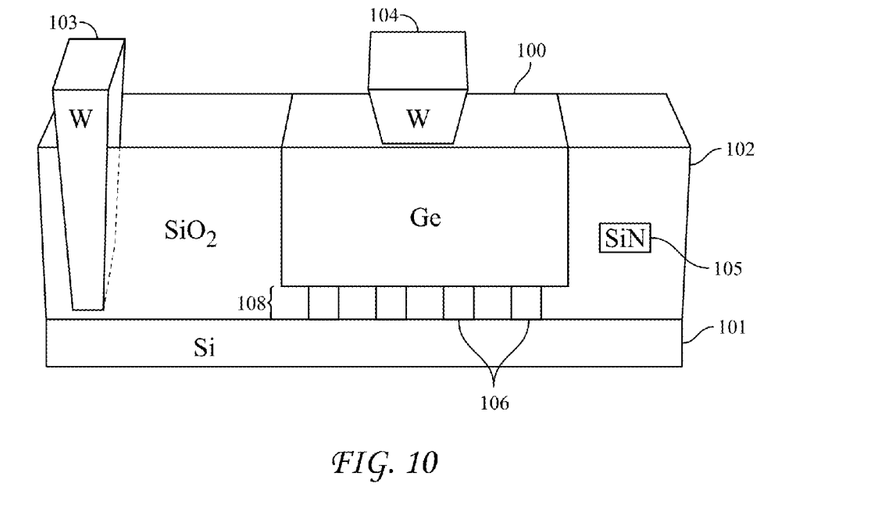
FIGS. 10 and 11 are partially schematic, perspective views of an avalanche diode that includes an aspect-ratio trapping feature in accordance with the present invention. Each figure illustrates a different placement of the evanescently coupled waveguide.
Figure 11:
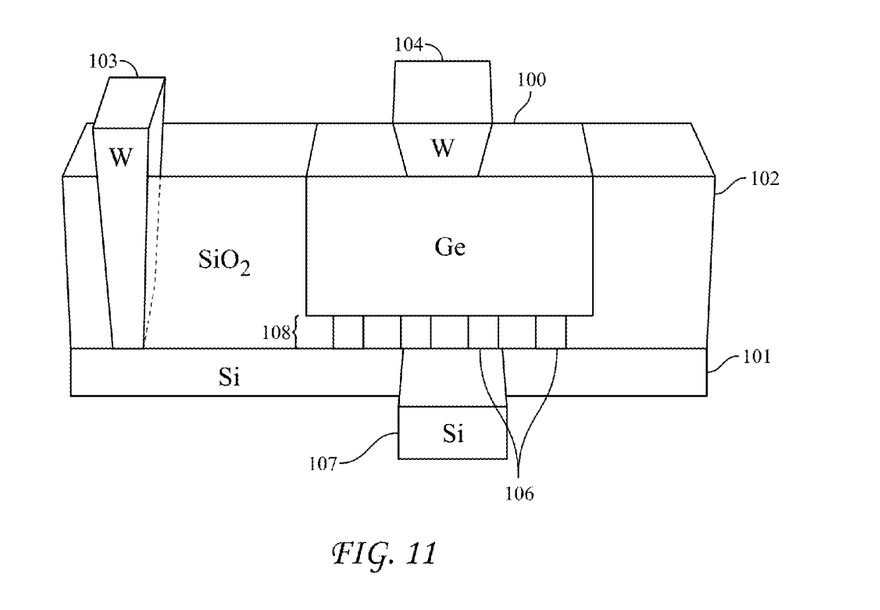

FIGS. 10 and 11 are partially schematic, perspective views of an avalanche diode, in two respective embodiments. Each embodiment includes an aspect-ratio trapping feature as described here. The two illustrated embodiments differ in the placement of the evanescently coupled waveguide. Corresponding features are designated in both figures using like reference numerals. All of the avalanche diode designs described above, and others, can readily be modified to incorporate the features shown in FIGS. 10 and 11, such changes being made as might be necessary to accommodate the placement of waveguides.

As seen in the figures, a germanium body 100 is grown in one or more oxide windows on a silicon body 101. The oxide windows are cut in a silicon oxide layer 102. Electrical contact to the germanium and silicon bodies is made using tungsten-filled vias 103 and 104. In the example of FIG. 10, an evanescently coupled silicon nitride waveguide 105 is formed within the oxide layer at a position laterally displaced from the germanium body. In the example of FIG. 11, an evanescently coupled silicon waveguide 107 is placed beneath (in the figure view) the germanium body. Silicon waveguide 107 is embedded in a portion of oxide layer 102, not visible in the figure, that lies nearer the substrate than the portion that is shown. The placement of silicon waveguide 107 in the figure is for presentation purposes only and does not correspond to the placement in an actual device. More details about the fabrication of an actual device will be presented below.

With further reference to FIGS. 10 and 11, it should be noted that the waveguide longitudinal axes extend in a direction perpendicular to the planes of the drawings. The same is true of the spacer features 108, which are described below.

Several alternative dispositions are possible for the waveguides. As explained above, the waveguide 105 of FIG. 10 is laterally displaced from germanium body 100, i.e. its longitudinal axis does not pass through the germanium body, but a common horizontal plane intercepts both the germanium body and the waveguide. As also explained above, the waveguide 107 of FIG. 11 is placed beneath the germanium body. By "below" or "beneath" is meant that the longitudinal axis of the waveguide lies in a horizontal plane that lies entirely beneath the germanium body, whether or not the waveguide is also laterally displaced from the germanium body. The meaning of "below" or "beneath" in this regard is "proximate the fabrication substrate", as will be understood by reference to the figure. In a third possible disposition for the waveguide, a ridge waveguide is formed in the oxide layer 102 at a position laterally displaced from the features 106 (described below). The optical mode of such a waveguide couples through the underlying silicon layer 101 upward into the germanium body.

It will be seen in both FIG. 10 and FIG. 11 that a portion 108 of oxide layer 102 occurs as a spacer layer between the germanium and silicon bodies. It will also be seen that germanium body 100 includes several projections 106 that extend down through the spacer layer to silicon body 101. The projections 106 consist of epitaxial germanium that fills trenches cut in oxide layer 102. The epitaxial growth of germanium body 100 begins with the growth of the projections 106. The number of trenches (hence the number of projections that are grown as trench fill) can be varied according to particular requirements. In at least some cases, a single trench will be sufficient. As will be seen below, when the trenches are appropriately dimensioned, they will suppress the propagation of threading discontinuities into the overlying, principal portion of the germanium body.

Photogenerated carriers must pass through the germanium-filled trenches in order to enter the silicon multiplication region. The dislocations trapped within the trenches can contribute to dark current. However, there is a net benefit because the aspect-ratio trapping reduces the defect concentration in the absorption region where the electron-hole pairs are generated. As a consequence, there is a net reduction in the rate of recombination. This is a particularly important advantage for single-photon detectors.

Moreover, the rate of dark-current generation tends to scale with the area of the silicon-germanium interface. The trench geometry reduces this area. As a consequence, devices that include the trenches are expected to suffer less dark current arising from interfacial mechanisms.

One well-known mechanism of dark-current generation is the Frenkel-Poole effect, which arises from field-assisted thermionic emission or tunneling from traps such as occur at lattice defects of various kinds, including interfacial defects. To suppress this effect, it is advantageous to engineer the charge-layer doping in such a way that the electric field is relatively low at the silicon-germanium interface. Of course some field must penetrate into the germanium in order for charge to be collected efficiently, and of course the field must be less than the germanium breakdown threshold. By judiciously doping the charge layer, it is possible to achieve a field that satisfies these two requirements, and that is also far enough below the breakdown threshold to realize improvements in the dark current. One example of how the charge layer can be engineered will be described below.

Figure 12:
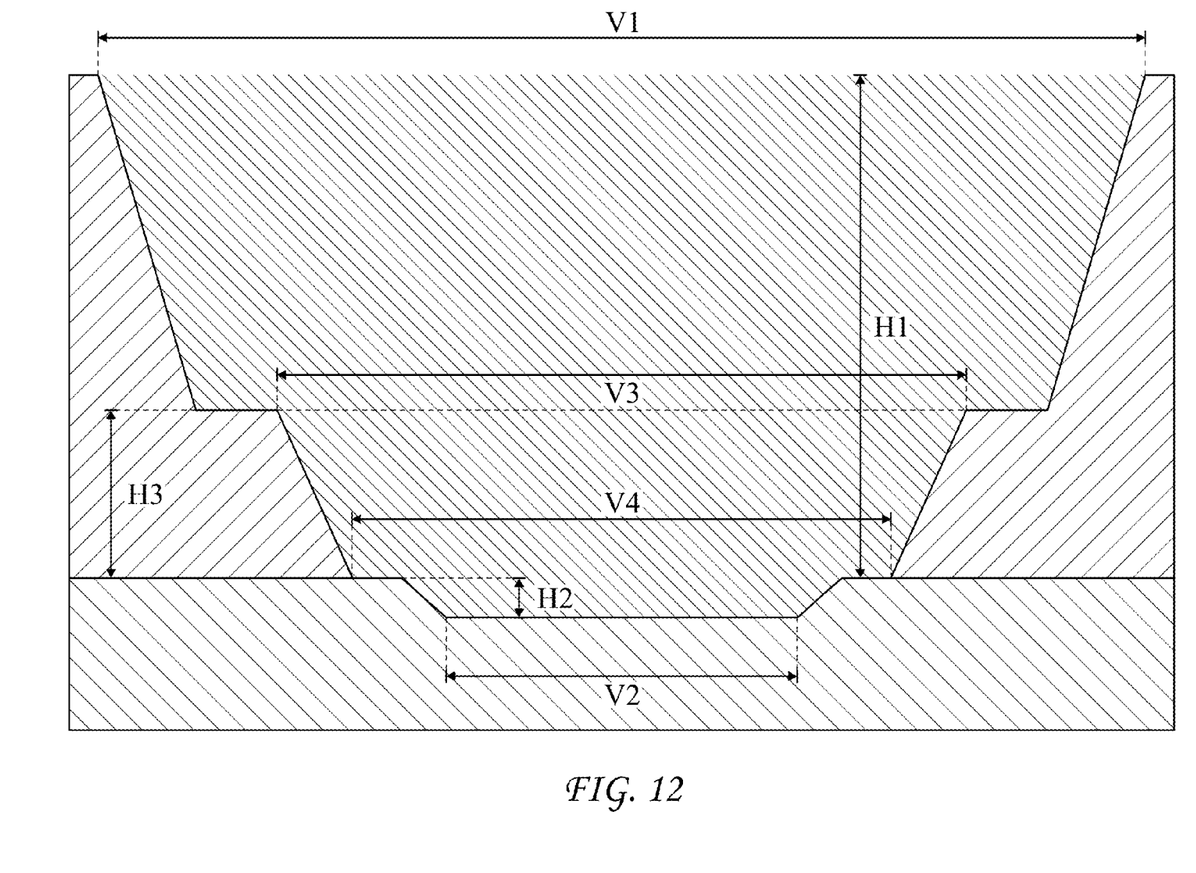
FIG. 12 provides an idealized cross-sectional view of a growth window and trench made according to the techniques described here.

An example of a trench that was provided for single-trench germanium growth is offered in FIG. 12. As seen in the figure, the trench and growth window were etched through the oxide layer to a combined depth of H1 from the top of the oxide layer down to the unetched silicon surface. The width of the growth window at its top was V1. The etched depth corresponding to the trench was H3. Silicon was etched away to a depth H2 to form a shallow cavity with a width V2 at the bottom in a step preparatory to the germanium growth. Exemplary values are: V1=1.305 m, V2=424.8 nm, H1=781.1 nm, H2=60.91 nm, H3=287.8 nm.

The widths marked as V3 and V4 in the figure are not believed to be critical and should be chosen to optimize the dislocation-trapping effect.

As explained above, the 4% lattice mismatch between silicon and germanium causes threading dislocations to form and to propagate during epitaxial growth of germanium on silicon. When germanium is grown, for example, on [001] silicon, dislocated surfaces grow at a crystallographically determined oblique angle to the silicon growth surface and stop where they intercept the walls of the growth window. The angle between (100) and (111) in silicon is 54.7°.

Dislocation growth is undesirable, because the trapping behavior of the dislocations leads to increased dark current.

Figure 13A:
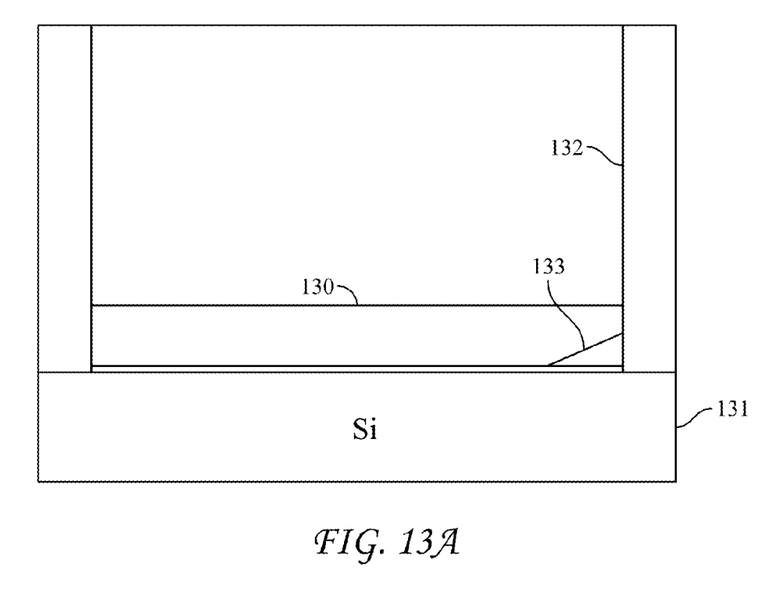
FIGS. 13A and 13B are idealized cross sections illustrating an early and a late stage of conventional germanium growth.
Figure 13B:
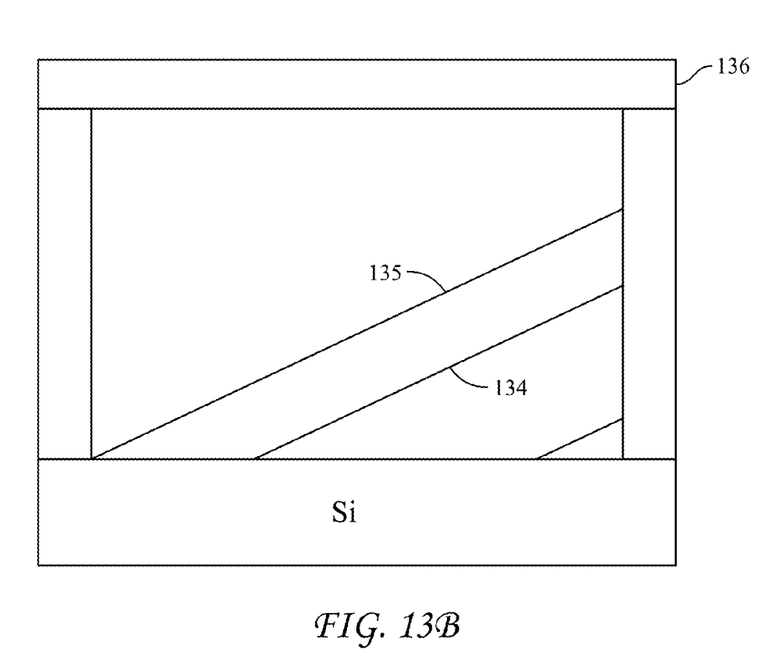

FIGS. 13A, 13B, 14A, and 14B provide a comparative example illustrating the benefits of aspect ratio trapping for germanium-on-silicon devices. FIGS. 13A and 13B are idealized cross sections illustrating an early and a late stage of conventional germanium growth. In FIG. 13A, a thin initial portion of the germanium body 130 has grown on the silicon body 131 within the growth window having oxide sidewalls 132. A dislocated surface 133 has formed, beginning at the silicon growth surface and terminating at the sidewall.

In FIG. 13B, the germanium growth has filled the growth window and above it has formed an overlapping germanium layer 136. During the growth, further dislocated surfaces 134 and 135 have formed. Like dislocated surface 133, these surfaces begin on the silicon growth surface and terminate on the sidewall. In the example of FIG. 13B, the entire area of the heterointerface between silicon body 131 and germanium body 130 can act as a source of dark current. Moreover, the entire volume of the germanium body is permeated with dislocations, which can likewise act as sources of dark current.

Figure 14A:
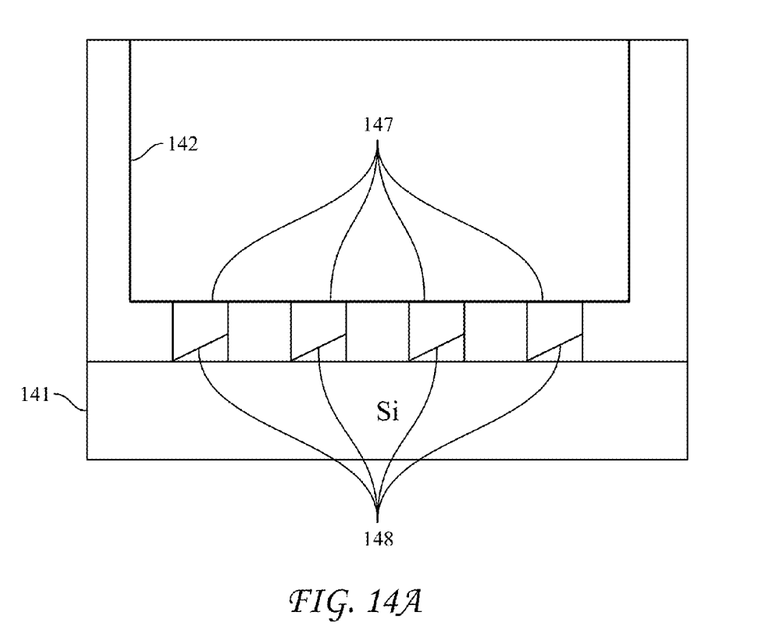
FIGS. 14A and 14B are idealized cross sections illustrating an early and a late stage of germanium growth according to the inventive technique.
Figure 14B:
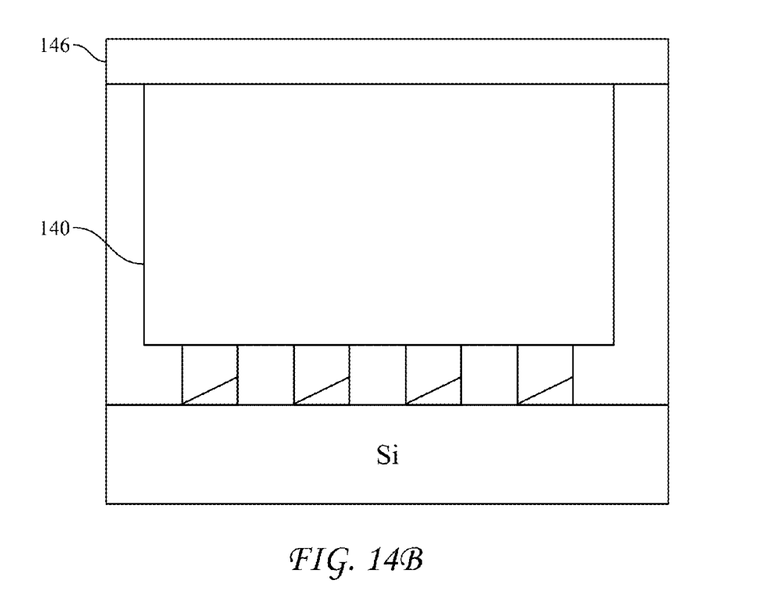

In FIG. 14A, a germanium body 140 is to be grown on a silicon substrate 141 within a growth window having oxide sidewalls 142. By contrast to FIGS. 13A and 13B, the initial growth now takes place within trenches 147. As seen in the figure, an initial dislocated surface 148 has formed in each of the trenches. Each dislocated surface begins at the silicon growth surface and terminates on the sidewall of the trench where it has formed. Turning to FIG. 14B, it will be seen that germanium body 140 has filled the growth window and lapped over it to form layer 146. However, dislocation growth has not propagated into the main portion of the germanium body, but instead has remained confined to the trenches. As a consequence, the total volume of germanium that is permeated with defects has been reduced. Due to the geometry of the trenches, the total area of the heterointerface effective for generating dark current has also been reduced.

Figure 15A:
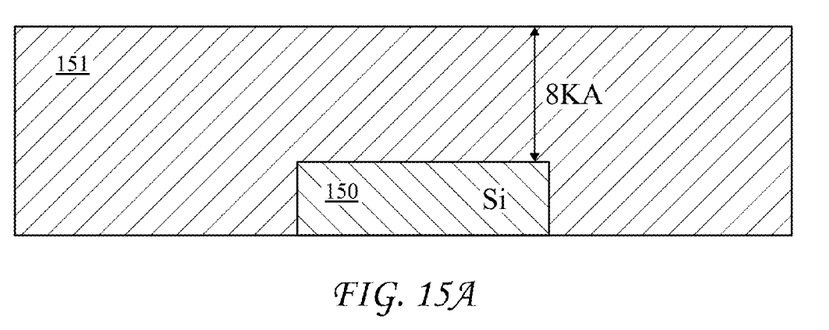
FIGS. 15A, 15B, and 15C illustrate an example etching procedure that we have used to form trenches and growth windows.
Figure 15B:
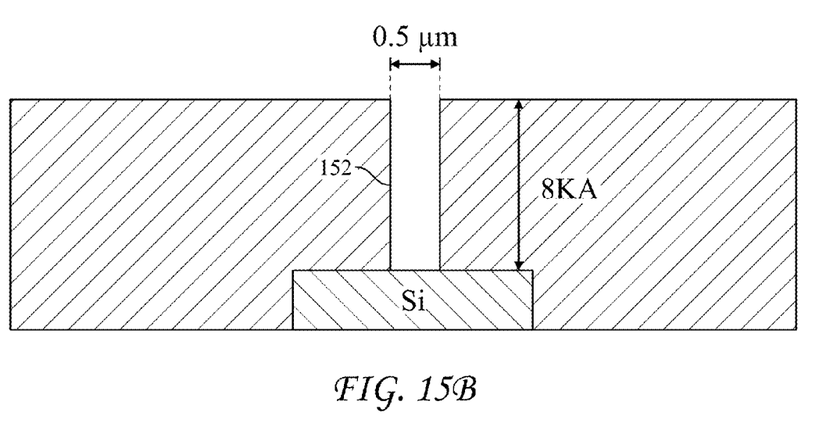
Figure 15C:
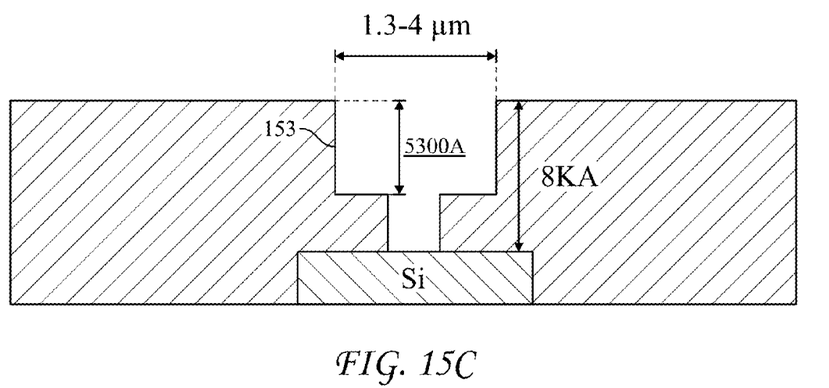

FIGS. 15A, 15B, and 15C illustrate an example etching procedure that we have used to form the trenches and growth window. FIG. 15A shows the silicon body 150 encased in a layer 151 of silicon dioxide deposited by high-density plasma chemical vapor deposition, with a depth of 0.8 μm between the silicon growth surface and the top of the oxide layer. In a first etching step, as illustrated in FIG. 15B, a contact etch through a patterned photoresist (also used as the germanium contact mask) cuts through the oxide down to the silicon surface to form a cavity 152 that is 0.5 μm wide. In a second etching step, a similar mask is used to widen the top portion 153 of the cavity to a width of 1.3-4 μm. The widened portion extends to a depth of 0.53 μm. The widened upper portion of the cavity will become the growth window for the main portion of the germanium body, and the underlying narrow portion will become the trench for mitigation of dislocation growth.

Figure 16:
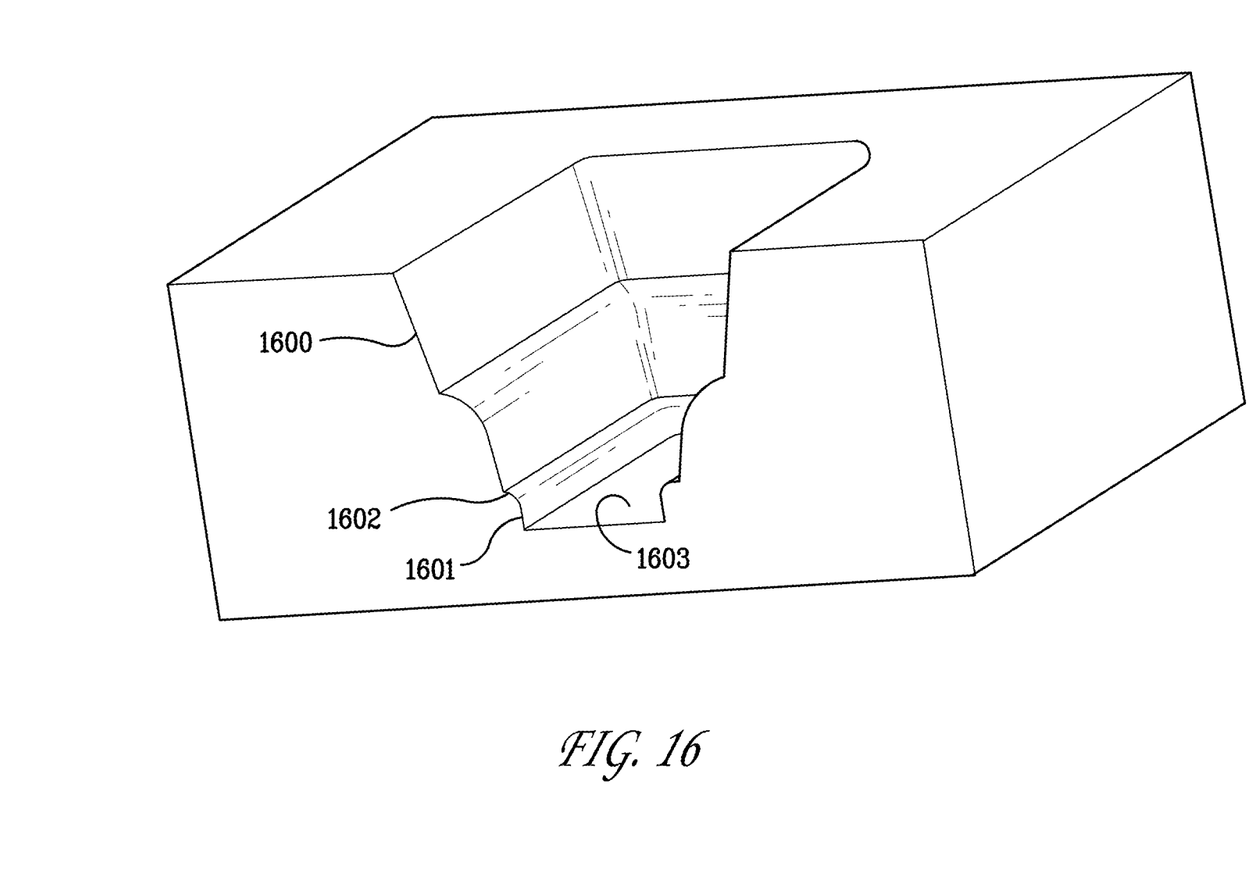
FIG. 16 is a perspective rendering, approximately to scale, based on a scanning electron micrograph of a growth window and trench made according to the methods described here.

FIG. 16 is a perspective rendering, approximately to scale, based on a scanning electron micrograph of a growth window and trench made as described above. Called out in the figure are upper sidewall 1600 of the growth window and sidewall 1601 of the trench. The workpiece as shown in the figure has already been subjected to the silicon etch in preparation for growing the germanium layer. The unetched portion of the silicon exposed by the growth window and trench appears in the figure as shoulder 1602 standing in positive relief above etched silicon surface 1603.

In an exemplary fabrication procedure for an avalanche photodiode device, waveguides and avalanche photodiodes (APDs) are fabricated from the active silicon layer of an SOI wafer. These devices are defined photolithographically and dry etched. The APDs are doped via ion implantation. The devices are covered in CVD oxide and planarized. Silicon nitride is deposited by PECVD, photolithographically patterned, covered in glass, and planarized.

As described above, a narrow opening for aspect-ratio trapping is dry etched all the way to the silicon surface for the APD. Then a second etch, also described above, defines the width of the device. The second etch does not cut all the way down to the silicon surface. The opening in the oxide is filled with epitaxial germanium. Selective germanium epitaxy is used to fill the opening and to overgrow the oxide surface. The germanium is then planarized with CMP and doped by ion implantation.

An oxide layer is deposited over the germanium. Electrical contacts to the silicon and germanium bodies are formed, and a metal layer is deposited and patterned over the contacts to facilitate electrical connection to the device.

As mentioned above, it can be advantageous, for dark-current suppression, to engineer the doping of the charge layer in order to reduce the electric field at the silicon-germanium interface. We made a device, which we refer to as a "buried channel" device, that provides one example of engineering of that kind.

The buried channel device has a p-type charge layer slightly larger than the overlying germanium layer. Using ion implantation, we created a small p+"buried channel" region centered directly beneath the germanium-filled trench. The buried channel was much smaller than the charge layer as a whole. The buried channel was effective to maintain a vertical field profile and to reduce the field near the interface.

Although the example devices described here use a germanium absorber, alternate embodiments are envisaged in which the absorber is composed of a silicon-germanium (SiGe) alloy. However, SiGe alloys have smaller optical absorption coefficients at pertinent wavelengths. Hence, it will generally be desirable to increase the absorption volume, for example by making the device longer than a comparable germanium-based device, in order to maintain the same level of performance when changing the absorber composition from germanium to SiGe.

What is claimed is:

1. An avalanche photodiode device comprising:
   a silicon body having a planar upper surface and containing a multiplication region;
   a germanium body laterally offset from the silicon multiplication region, grown epitaxially on portions of the silicon upper surface, and containing an absorption region;
   a waveguide optically coupled to the germanium body with respect to light of at least one operating wavelength; and
   a dielectric spacer region interposed between the silicon body and a major portion of the germanium body;
   wherein the dielectric spacer region is formed with one or more aspect-ratio-trapping trenches extending vertically through the dielectric spacer region from the silicon body to the major portion of the germanium body; and
   the germanium body comprises said major portion and further comprises a dislocation-trapping portion consisting of epitaxial germanium filling each of said one or more aspect-ratio-trapping trenches.

2. The avalanche photodiode device of claim 1, wherein the germanium body is composed substantially of a silicon-germanium alloy.

3. The avalanche photodiode device of claim 1, wherein the waveguide is optically coupled to the germanium body by evanescent coupling.

4. The avalanche photodiode device of claim 1, wherein the waveguide is laterally displaced from the germanium body.

5. The avalanche photodiode device of claim 1, wherein the waveguide is situated below the germanium body.

6. The avalanche photodiode device of claim 1, wherein the germanium body is electrically continuous with the silicon body solely through the one or more dislocation-trapping germanium portions.

7. The avalanche photodiode device of claim 1, wherein the waveguide is composed substantially of silicon.

8. The avalanche photodiode device of claim 1, wherein the waveguide is composed substantially of silicon nitride.

\* \* \* \* \*